United States Patent
Roh et al.

(10) Patent No.: US 10,693,489 B2
(45) Date of Patent: Jun. 23, 2020

(54) CIRCUIT AND METHOD FOR DIGITAL-TO-ANALOG CONVERSION USING THREE-LEVEL CELLS

(71) Applicant: SAMSUNG ELECTRONICS CO., LTD., Suwon-si, Gyeonggi-do (KR)

(72) Inventors: Hyung-Dong Roh, Yongin-si (KR); Jae-Keun Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/191,584

(22) Filed: Nov. 15, 2018

(65) Prior Publication Data

US 2019/0229748 A1 Jul. 25, 2019

(30) Foreign Application Priority Data

Jan. 22, 2018 (KR) .................. 10-2018-0007892

(51) Int. Cl.
*H03M 1/74* (2006.01)
*H03M 3/00* (2006.01)
*H03M 1/06* (2006.01)

(52) U.S. Cl.
CPC ........... *H03M 1/747* (2013.01); *H03M 1/066* (2013.01); *H03M 1/0665* (2013.01); *H03M 3/502* (2013.01)

(58) Field of Classification Search
CPC .... H03M 1/747; H03M 1/0665; H03M 3/502; H03M 1/066
USPC ........................................ 341/144, 155, 120
See application file for complete search history.

(56) References Cited

U.S. PATENT DOCUMENTS

| | | | |
|---|---|---|---|
| 6,556,161 B2 | 4/2003 | Nuijten | |
| 7,006,589 B2 | 2/2006 | Staszewski et al. | |
| 7,079,063 B1 | 7/2006 | Nguyen et al. | |
| 7,095,350 B2 | 8/2006 | Hagiwara et al. | |
| 7,173,548 B2 | 2/2007 | Yen | |
| 7,369,076 B1* | 5/2008 | Chung | H03M 1/682 341/144 |
| 7,629,911 B2 | 12/2009 | Hagiwara et al. | |
| 7,777,658 B2 | 8/2010 | Nguyen et al. | |
| 7,812,753 B1 | 10/2010 | Myles et al. | |
| 9,112,528 B1* | 8/2015 | Currivan | H03M 1/002 |
| 9,214,953 B1 | 12/2015 | Mengad | |
| 9,484,947 B1* | 11/2016 | Nguyen | H03M 1/066 |
| 10,340,935 B1* | 7/2019 | Tanabe | H03M 1/68 |

* cited by examiner

*Primary Examiner* — Brian K Young

(74) *Attorney, Agent, or Firm* — Volentine, Whitt & Francos, PLLC

(57) ABSTRACT

A circuit for digital-to-analog conversion using a plurality of 3-level cells includes a circuit for digital-to-analog conversion using a plurality of 3-level cells mutually independently providing positive electricity, providing negative electricity, or floating. The circuit including a preprocess circuit and a shift circuit. The preprocess circuit is configured to receive thermometer code data generated from signed binary data and generate a shift count for shifting a cell pointer pointing to one of the plurality of 3-level cells for dynamic element matching (DEM) from the thermometer code data. The shift circuit is configured to store the cell pointer and shift the stored cell pointer according to the shift count. The shifted cell pointer is shifted in proportion to an absolute value of the binary data in a direction depending on a sign of the binary data.

20 Claims, 17 Drawing Sheets

FIG. 3A

| BIN | C4 | C3 | C2 | C1 |
|---|---|---|---|---|
| −1 | −1 | 0 | 0 | 0 |
| −2 | −1 | −1 | 0 | 0 |
| 0 | 0 | 0 | 0 | 0 |
| 2 | +1 | +1 | 0 | 0 |
| 1 | +1 | 0 | 0 | 0 |
| −2 | −1 | −1 | 0 | 0 |
| 1 | +1 | 0 | 0 | 0 |

Time ↓

(Related Art)

(Related Art)

(Related Art)

(Related Art)

(Related Art)

FIG. 7

| BIN | T_CD | C_CD[4] | C_CD[3] | C_CD[2] | C_CD[1] | P' | N' | Z' |
|---|---|---|---|---|---|---|---|---|
| −4 | 00000000 | −1 | −1 | −1 | −1 | 0000 | 1111 | 0000 |
| −3 | 00000001 | −1 | −1 | −1 | 0 | 0000 | 1110 | 0001 |
| −2 | 00000011 | −1 | −1 | 0 | 0 | 0000 | 1100 | 0011 |
| −1 | 00000111 | −1 | 0 | 0 | 0 | 0000 | 1000 | 0111 |
| 0 | 00001111 | 0 | 0 | 0 | 0 | 0000 | 0000 | 1111 |
| 1 | 00011111 | 0 | 0 | 0 | +1 | 0001 | 0000 | 1110 |
| 2 | 00111111 | 0 | 0 | +1 | +1 | 0011 | 0000 | 1100 |
| 3 | 01111111 | 0 | +1 | +1 | +1 | 0111 | 0000 | 1000 |
| 4 | 11111111 | +1 | +1 | +1 | +1 | 1111 | 0000 | 0000 |

| BIN | CNT | Shift |
|---|---|---|
| -4 | 0000 | 0 |
| -3 | 0001 | 1 |
| -2 | 0011 | 2 |
| -1 | 0111 | 3 |
| 0 | 1111 | 4(0) |
| 1 | 0001 | 1 |
| 2 | 0011 | 2 |
| 3 | 0111 | 3 |
| 4 | 1111 | 4(0) |

| BIN | CNT | Shift |
|---|---|---|
| −4 | 0000 | 0 |
| −3 | 0001 | 1 |
| −2 | 0011 | 2 |
| −1 | 0111 | 3 |
| 0 | 0000 | 0 |
| 1 | 0001 | 1 |
| 2 | 0011 | 2 |
| 3 | 0111 | 3 |
| 4 | 1111 | 4(0) |

CIRCUIT AND METHOD FOR DIGITAL-TO-ANALOG CONVERSION USING THREE-LEVEL CELLS

CROSS-REFERENCE TO RELATED APPLICATION

This application claims the benefit of Korean Patent Application No. 10-2018-0007892, filed on Jan. 22, 2018, in the Korean Intellectual Property Office, the disclosure of which is incorporated herein in its entirety by reference.

BACKGROUND

The disclosure relates to digital-to-analog conversion, and more particularly, to a circuit and method for digital-to-analog conversion using 3-level cells.

A digital-to-analog converter (DAC) may be used in various applications. The DAC may include a plurality of cells having the same structure, and may generate an analog output signal according to signals output by the cells in response to a digital input signal. For example, the DAC may include 2-level or bi-level cells capable of providing two or more different outputs in response to a control signal, or may include multi-level cells capable of providing three or more different outputs in response to a control signal. Although the DAC including the multi-level cells has many merits compared to the 2-level or bi-level cells, compensation of non-linearity inside the cells may be required due to characteristics of the cells providing three or more different outputs.

SUMMARY

The disclosure, which relates to digital-to-analog conversion, provides a circuit and method for digital-to-analog conversion using 3-level cells.

According to an aspect of the disclosure, there is provided a circuit for digital-to-analog conversion using a plurality of 3-level cells mutually independently providing positive electricity, negative electricity, or floating. The circuit including: (a) a preprocess circuit configured to receive thermometer code data generated from signed binary data and generate a shift count for shifting a cell pointer pointing to one of the plurality of 3-level cells for dynamic element matching (DEM) from the thermometer code data and (b) a shift circuit configured to store the cell pointer and shift the stored cell pointer according to the shift count. The shifted cell pointer is shifted in proportion to an absolute value of the binary data in a direction depending on a sign of the binary data.

According to another aspect of the disclosure, there is provided a circuit for digital-to-analog conversion using m 3-level cells mutually independently providing positive electricity, providing negative electricity, or floating, where the m is an integer greater than 1. The circuit including: (a) a preprocess circuit including a first logic circuit configured to output a shift count for shifting a cell pointer pointing to one of the m 3-level cells for dynamic element matching (DEM), by performing a bitwise operation on thermometer code data, which is 2 m bits, generated from signed binary data, and (b) a shift circuit including a latch storing the cell pointer and a first shifter configured to shift the cell pointer stored in the latch according to the shift count. An output of the first shifter coincides with the cell pointer stored in the latch being shifted in proportion to an absolute value of the binary data in a direction depending on a sign of the binary data.

According to another aspect of the disclosure, there is provided a method for digital-to-analog conversion using a plurality of 3-level cells mutually independently providing positive electricity, negative electricity, or floating. The method including: (a) receiving thermometer code data generated from signed binary data; (b) generating a shift count for shifting a cell pointer pointing to one of the plurality of 3-level cells for dynamic element matching (DEM) from the thermometer code data; and (c) shifting the cell pointer according to the shift count and storing the cell pointer. The shifted cell pointer is shifted in proportion to an absolute value of the binary data in a direction depending on a sign of the binary data.

According to another aspect of the disclosure, there is provided a digital-to-analog converter having an analog generator circuit and a dynamic element matching circuit. The analog generator circuit includes m voltage-generator circuits, a differential amplifier, an integrator circuit, and a single-ended output amplifier, where the m is an integer greater than 1. The dynamic element matching circuit: (a) generates an m-bit signed binary code representing a signed digital value, and (b) selects, for each bit of the m-bit signed binary code and based on an absolute value and a sign of the signed digital value, which of the m voltage-generator circuits generates both a first signal applied to a first input terminal of the differential amplifier and a second signal applied to a second input terminal of the differential amplifier. The differential amplifier amplifies, for each bit of the m-bit signed binary code, a voltage difference between the first signal applied to the first input terminal and the second signal applied to the second input terminal to generate an amplified differential output. The integrator circuit integrates, for each bit of the m-bit signed binary code, the amplified differential output to generate an integrated differential signal. The single-ended output amplifier converts the integrated differential signal into a single-ended analog signal having a voltage value, among 2 m+1 voltage values, representing the signed digital value.

BRIEF DESCRIPTION OF THE DRAWINGS

Embodiments of the disclosure will be more clearly understood from the following detailed description taken in conjunction with the accompanying drawings in which:

FIGS. 3A to 3C are related-art diagrams illustrating comparative examples of controlling four cells according to a given input sequence;

FIG. 7 is a table illustrating an example of data of FIG. 1 and control signals of FIG. 2 according to an example embodiment of the present disclosure;

DETAILED DESCRIPTION OF THE EMBODIMENTS

Figure 1:
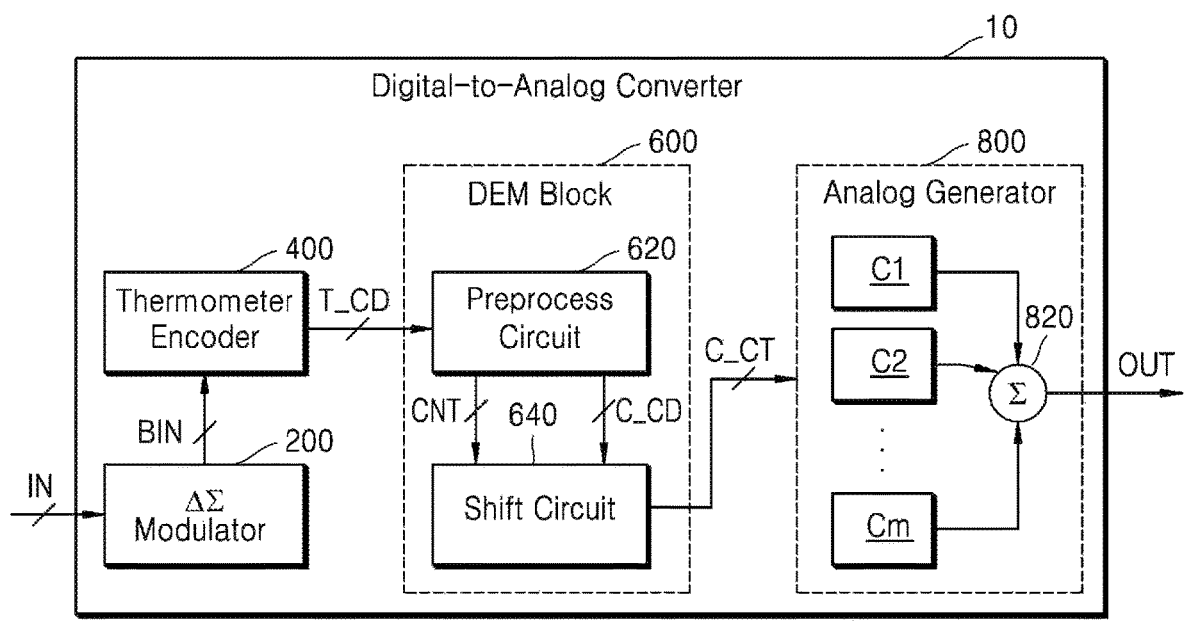
FIG. 1 is a block diagram illustrating a digital-to-analog converter (DAC) according to an example embodiment of the present disclosure.

FIG. 1 is a block diagram illustrating a digital-to-analog converter (DAC) 10 according to an example embodiment of the present disclosure. The DAC 10, which is a delta-sigma DAC, may output an output signal OUT, which is an analog signal, by converting an input signal IN, which is a digital signal. As illustrated in FIG. 1, the DAC 10 may include a delta-sigma modulator 200, a thermometer encoder 400, a dynamic element matching (DEM) block 600, and an analog generator 800.

The delta-sigma modulator 200 may be referred to as an oversampling delta-sigma modulator, and may generate binary data (or binary code) BIN by oversampling the input signal IN. In some embodiments, the delta-sigma modulator 200 may interpolate oversampled signals. The delta-sigma modulator 200 may provide the binary data BIN to the thermometer encoder 400. In some embodiments, the binary data BIN may be signed data.

The thermometer encoder 400 may convert the binary data BIN received from the delta-sigma modulator 200 to thermometer code data T_CD. The thermometer code data T_CD may have k bits (where k is an integer equal to or greater than 1), and may be represented as continuous bits having "0" and/or continuous bits having "1". The thermometer code data T_CD may be referred to as unary code data, and in some embodiments, as illustrated in FIG. 7, the thermometer code data T_CD may include "1's" as many as the number proportional to the binary data BIN. The thermometer encoder 400 may provide the thermometer code data T_CD to the DEM block 600.

The DEM block 600 may generate cell control data C_CT from the thermometer code data T_CD received from the thermometer encoder 400. The DEM block 600 may perform DEM as an operation of compensating for non-linearity of the DAC 10, that is, non-linearity of m cells C1, C2, . . . , and Cm included in the analog generator 800 (where m is an integer equal to or greater than 1). As described below with reference to FIGS. 3A to 3C, as an example of DEM, data weighted averaging (DWA), in which a plurality of cells contributing to analog output are evenly selected to average errors occurring in the cells, may be employed. 2-level or bi-level cells responding to a control signal having two different states generate two outputs corresponding to two levels and therefore may have linearity, and accordingly, only improvement of non-linearity between the cells may be required. On the other hand, multi-level cells responding to a control signal having three or more different states may have non-linearity inside the cells, and thus, not only improvement of non-linearity between the cells but also improvement of non-linearity inside the cells may be required. Compared to a DAC including 2-level or bi-level cells, the DAC 10 including 3-level cells may include a decreased number of cells, and accordingly, may have decreased area and power consumption. In addition, in the DAC 10 including 3-level cells, the 3-level cells provide floating according to an input of 0, and therefore, the influence of noise that may be made in the cells may decrease. Likewise, although the DAC 10 including 3-level cells has various merits, as described above, improvement of non-linearity between the cells may be required.

As described below, according to example embodiments of the present disclosure, the DEM block 600 may provide improved linearity, and may have a simple structure. Due to the simple structure of the DEM block 600, power consumption and an area of the DAC 10 may decrease, and accordingly, utility of the DAC 10 may increase. Although it will be hereinafter assumed that each of the m cells C1, C2, . . . , and Cm is a 3-level cell, example embodiments of the present disclosure are not limited thereto.

The DEM block 600 may manage a cell pointer pointing to one of the m cells C1, C2, . . . , and Cm of the analog generator 800. The DEM block 600 may generate the cell control data C_CT to select a cell pointed by the cell pointer, and may shift the cell pointer based on the thermometer code data T_CD. The cell control data C_CT may include information regarding an output provided by each of the m cells C1, C2, . . . , and Cm. In the present specification, the cell control data C_CT will be described as including m values each having one of "−1", "0", and "+1" for the m cells C1, C2, . . . , and Cm, which are 3-level cells. In some embodiments, the cell control data C_CT may include control signals which are directly applied to the m cells C1, C2, . . . , and Cm, or control signals which are applied to the m cells C1, C2, . . . , and Cm may be generated from the cell control data C_CT in the analog generator 800. As illustrated in FIG. 1, the DEM block 600 may include a preprocess circuit 620 and a shift circuit 640.

The preprocess circuit 620 may generate a shift count CNT and cell code data C_CD from the thermometer code data T_CD received from the thermometer encoder 400. The shift count CNT may be used to shift the cell pointer in the shift circuit 640. In some embodiments, the shift circuit 640 may cyclic or circular shift the cell pointer unidirectionally, and the shift count CNT may correspond to a shift amount of the cell pointer. In addition, as described below with reference to FIGS. 8A and 8B, the shift count CNT may have m bits, and in a similar way to a thermometer code, may have "1's" as many as the number corresponding to the shift amount.

The preprocess circuit 620 may generate the shift count CNT to shift the cell pointer in proportion to an absolute value of the binary data BIN in a direction depending on a sign of the binary data BIN. In some embodiments, when the binary data BIN is positive, the cell pointer may be shifted to the right, that is, towards a least significant bit (LSB), and when the binary data BIN is negative, the cell pointer may be shifted to the left, that is, towards a most significant bit (MSB). In some embodiments, when the binary data BIN is positive, the cell pointer may be shifted to the left, that is, towards the MSB, and when the binary data BIN is negative, the cell pointer may be shifted to the right, that is, towards the LSB. As a shift direction is changed according to a sign of the binary data BIN, as described below with reference to FIGS. 6A and 6B, better non-linearity improvement characteristics may be obtained, and use of only one cell pointer may enable a simpler structure. Examples of an operation in which the preprocess circuit 620 generates the shift count CNT will be described below with reference to FIG. 5, etc.

The preprocess circuit 620 may generate the cell code data C_CD from the thermometer code data T_CD. In some embodiments, the preprocess circuit 620 may generate m-bit cell code data C_CD from 2m-bit thermometer code data T_CD (that is, k=2 m). The cell code data C_CD may correspond to the cell control data C_CT, and the cell control data C_CT may be generated by shifting the cell code data C_CD based on cell pointing. In some embodiments, the cell control data C_CT may be in one-to-one correspondence with the thermometer code data T_CD. That is, although one value of the 2m-bit thermometer code data T_CD may correspond to a plurality of values of the m-bit cell code data C_CD, the preprocess circuit 620 may allow one value of the thermometer code data T_CD to correspond to one value from among a plurality of values of the cell code data C_CD. In the present specification, in a similar way to the cell control data C_CT, the cell code data C_CD will be described as including m values each having one of "−1", "0", and "+1".

The shift circuit 640 may receive the shift count CNT and the cell code data C_CD from the preprocess circuit 620, and may generate the cell control data C_CT. The shift circuit 640 may store a cell pointer that will be used to generate the cell control data C_CT, and may shift the stored cell pointer according to the shift count CNT. In some embodiments, the shift circuit 640 may cyclic or circular shift the cell pointer bidirectionally according to the shift count CNT. As a result, the cell pointer may be shifted in different directions according to a sign of the binary data BIN. The shift circuit 640 may generate the cell control data C_CT by shifting the cell code data C_CD according to the stored cell pointer, and may shift the cell pointer used in shifting according to the shift count CNT and store the shifted cell pointer. An example of the shift circuit 640 will be described with reference to FIG. 9.

The analog generator 800 may receive the cell control data C_CT from the DEM block 600, and may generate the output signal OUT. As illustrated in FIG. 1, the analog generator 800 may include the m cells C1, C2, ..., and Cm and a summer 820.

The m cells C1, C2, ..., Cm may have the same structure, and may operate mutually independently according to control signals. Each of the m cells C1, C2, ..., Cm, which is a 3-level cell, may provide one of positive electricity, negative electricity, and floating (or non-output) as an output in response to the control signals. As described below with reference to FIG. 2, each of the m cells C1, C2, ..., Cm may be designed such that sizes of positive electricity and negative electricity which will be provided coincide. In the present specification, each of the m cells C1, C2, ..., Cm will be described as providing negative electricity when a corresponding value of the cell control data C_CT including m values is "−1", providing floating when the corresponding value is "0", and providing positive electricity when the corresponding value is "+1".

The summer 820 may generate the output signal OUT by summing outputs of the m cells C1, C2, ..., Cm. Accordingly, the output signal OUT may have "2 m+1" different sizes from sizes corresponding to the m cells C1, C2, ..., Cm all providing positive electricity to sizes corresponding to the m cells C1, C2, ..., Cm all providing negative electricity. An example of the analog generator 800 will be described below with reference to FIG. 2.

Figure 2:
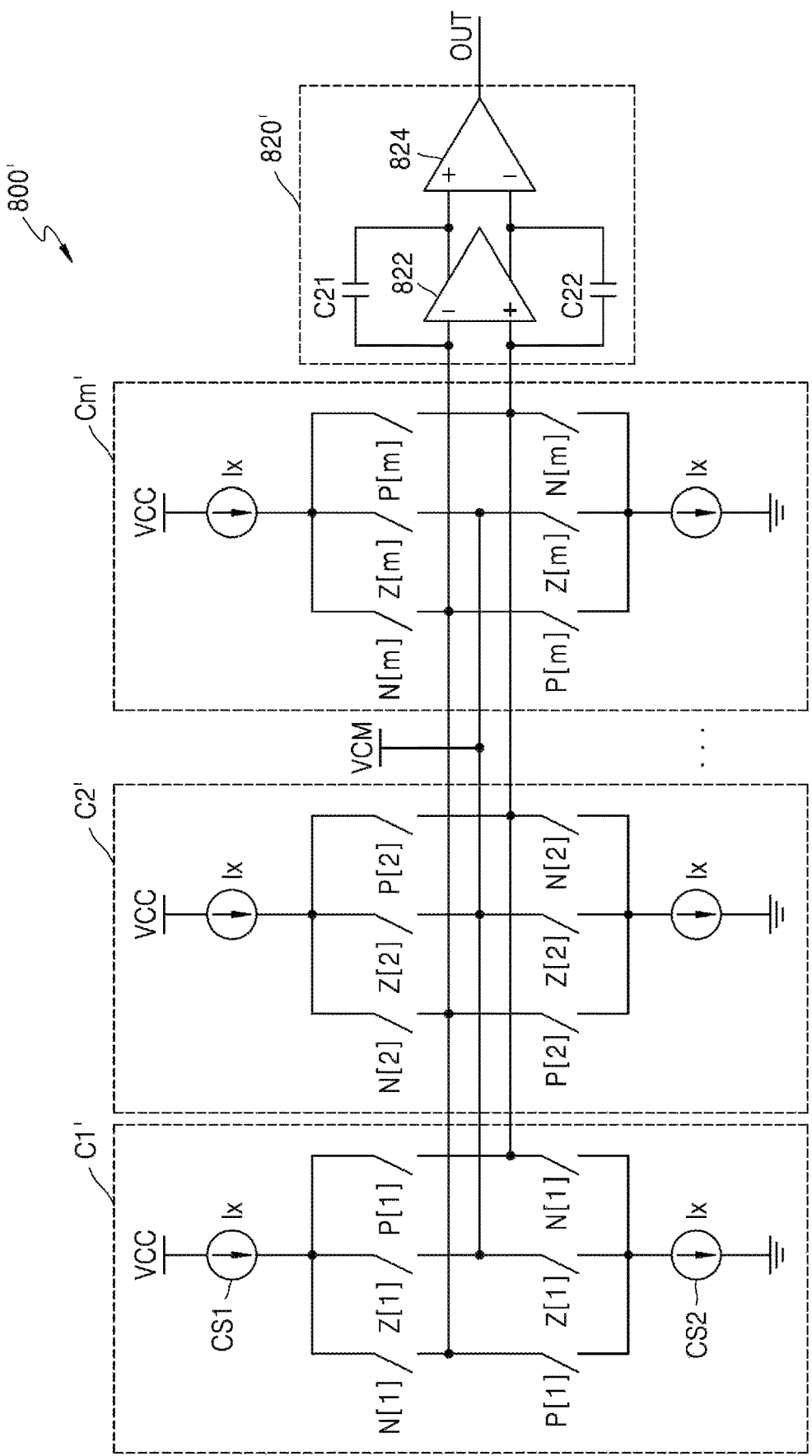
FIG. 2 is a circuit diagram illustrating an example of an analog generator of FIG. 1 according to an example embodiment of the present disclosure.

FIG. 2 is a circuit diagram illustrating an example of the analog generator 800 of FIG. 1 according to an example embodiment of the present disclosure. As described above with reference to FIG. 1, an analog generator 800' of FIG. 2 may receive the cell control data C_CT from the DEM block 600, and may generate the output signal OUT, which is an analog signal, according to the cell control data C_CT. As illustrated in FIG. 2, the analog generator 800' may include m cells C1', C2', ..., and Cm' and a summer 820'. FIG. 2 will be described with reference to FIG. 1.

Control signals may be generated from the cell control data C_CT including m values each having "−1", "0", or "+1". For example, an m-bit first control signal P may determine whether each of the m cells C1', C2', ..., and Cm' provides positive electricity to the summer 820', a second control signal N may determine whether each of the m cells C1', C2', ..., and Cm' provides negative electricity to the summer 820', and a third control signal Z may determine whether each of the m cells C1', C2', ..., and Cm' provides floating to the summer 820'. Mutually corresponding two bits of the first control signal P and the second control signal N may not have a value of "1" at the same time, and when corresponding bits of the first control signal P and the second control signal N both are "0", the third control signal Z may have a value of "1". In the present specification, a cell corresponding to "+1" or "−1" may be referred to as the cell being selected. In some embodiments, the cell control data C_CT may include at least one of the first, second, and third control signals P, N, and Z, and when the cell control data C_CT includes two or fewer from among the first, second, and third control signals P, N, and Z, the remaining control signal(s) not included may be generated from a control signal received from the analog generator 800'.

Each of the m cells C1, C2', ..., and Cm' may include two current sources and six switches. For example, the first cell C1' may include a first current source CS1 supplying a current Ix from a positive supply voltage VCC and a second current source CS2 withdrawing the current Ix to a ground voltage (or a negative supply voltage), and three pairs of switches each including two switches connected in series between the first and second current sources CS1 and CS2. Each of the six switches may electrically connect both ends thereof according to a control signal having "1". For example, when a first bit P[1] of the first control signal P is "1" in the first cell C1', the current Ix may be provided to a node connected to a non-inverting input terminal of a first amplifier 822 included in the summer 820' by the first current source CS1, whereas the current Ix may be withdrawn from a node connected to an inverting input terminal of the first amplifier 822 by the second current source CS2. When a first bit N[1] of the second control signal N is "1" in the first cell C1', the current Ix may be provided to the node connected to the inverting input terminal of the first amplifier 822 by the first current source CS1, whereas the current Ix may be withdrawn from the node connected to the non-inverting input terminal of the first amplifier 822 by the second current source CS2. When a first bit Z[1] of the third control signal Z is "1", the current Ix may flow from the positive supply voltage VCC to the ground voltage due to the first and second current sources CS1 and CS2. As illustrated in FIG. 2, a certain voltage VCM may be applied to a node to which two switches that are controlled by the first bit Z[1] of the third control signal Z are connected. The second cell C2' operates with respect to a second bit P[2] of the first control signal P, a second bit N[2] of the second control signal N, and a second bit Z[2] of the third control signal Z in a manner similar to how the first cell C1' operates with respect to the first bit P[1] of the first control signal P, the first bit N[1] of the second control signal N, and the first bit Z[1] of the third control signal Z. And, the m-th cell Cm' operates with respect to an m-th bit P[m] of the first control signal P, an m-th bit N[m] of the second control signal N, and an m-th bit Z[m] of the third control signal Z in a manner similar to how the first cell C1' operates with respect to the first bit P[1] of the first control signal P, the first bit N[1] of the second control signal N, and the first bit Z[1] of the third control signal Z.

The summer 820' may include the first amplifier 822, a second amplifier 824, and capacitors C21 and C22. The first amplifier 822 may have the inverting input terminal and the non-inverting input terminal, and may serve as an integrator along with the capacitors C21 and C22. Accordingly, a signal corresponding to electricity that is a sum of positive electricity and negative electricity provided to the inverting input terminal and the non-inverting input terminal of the first amplifier 822 by the m cells C1', C2', ..., and Cm' may be provided to the second amplifier 824. The second amplifier 824 may generate a single-ended signal from a differential signal, and may generate the output signal OUT having a size corresponding to a difference in signals output by the first amplifier 822.

Hereinafter, for convenience of description, it will be assumed in example embodiments of the present disclosure that the analog generator 800 of FIG. 1 includes four 3-level cells (that is, m=4). In addition, it will be assumed that the thermometer code data T_CD is 8 bits (that is, k=8), and it will be assumed that the cell code data C_CD and the cell control data C_CT include four values each having one of "−1", "0", and "+1". However, it will be understood that example embodiments of the present disclosure may also be applied to an analog-to-digital converter including five or more 3-level cells.

Figure 3B:
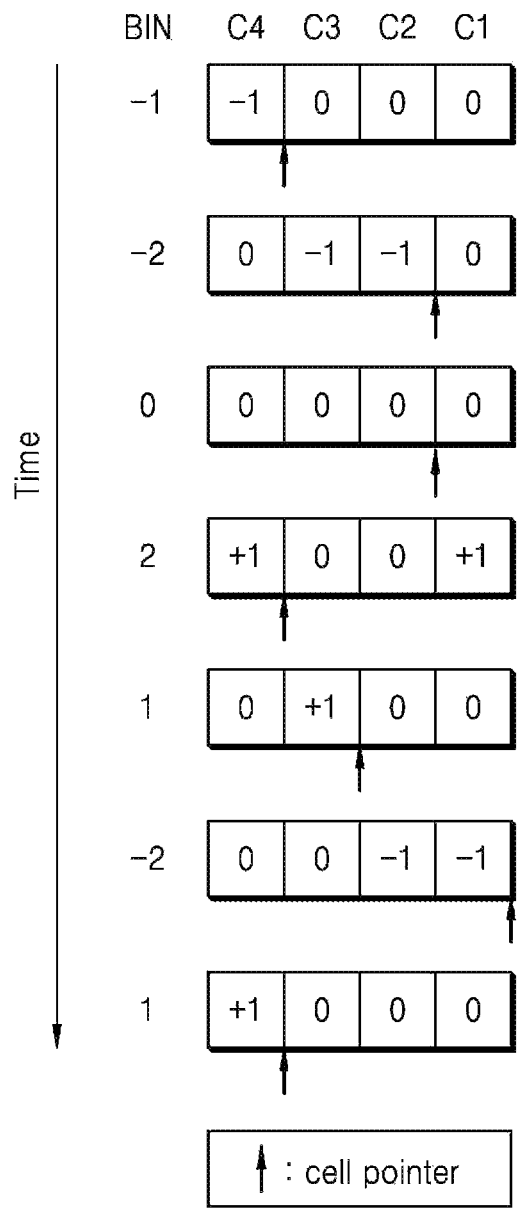
Figure 3C:
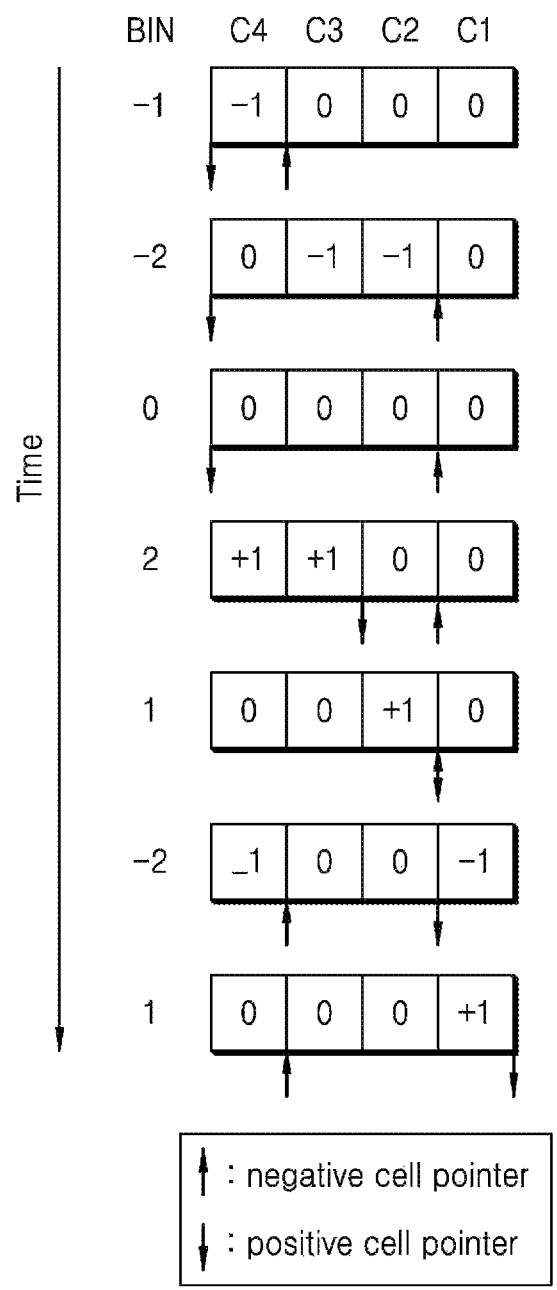
Figure 4A:
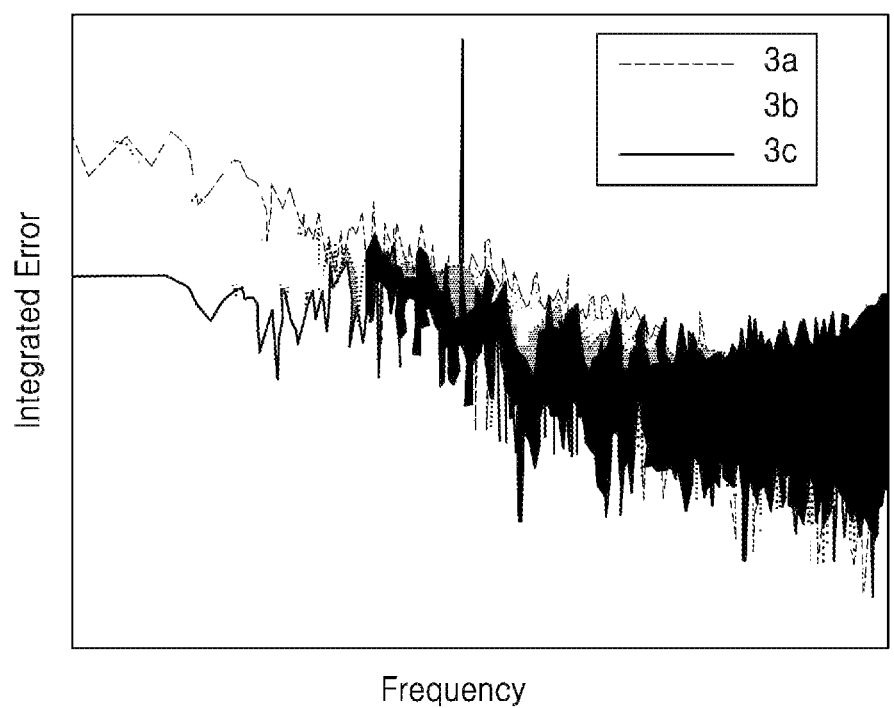
FIGS. 4A and 4B are related-art graphs illustrating the performance of the comparative examples of FIGS. 3A to 3C.
Figure 4B:
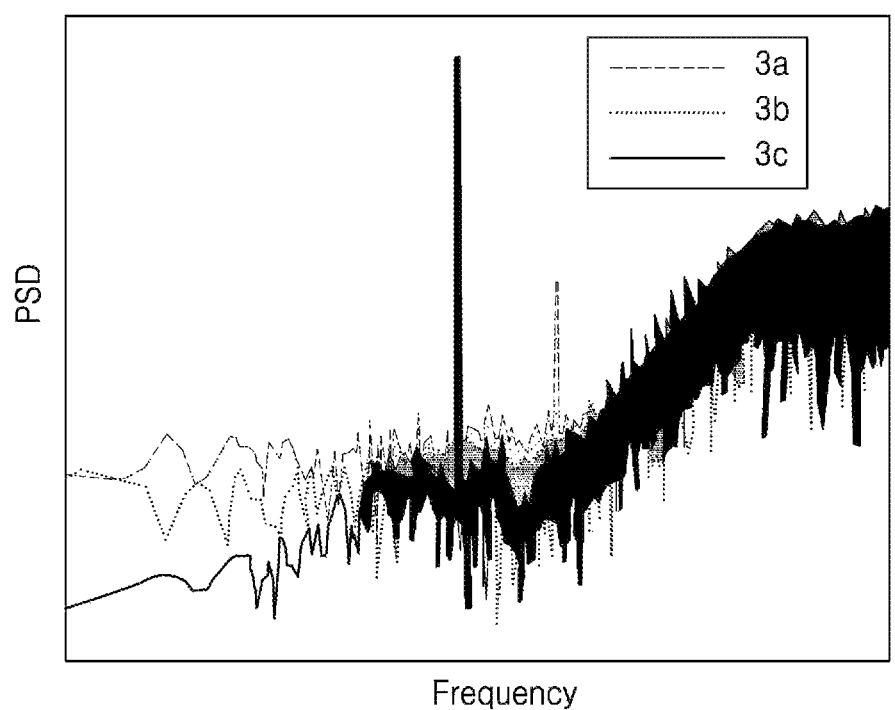

FIGS. 3A to 3C are related-art diagrams illustrating comparative examples of controlling the four cells C1, C2, C3, and C4 according to a given input sequence. FIGS. 4A and 4B are related-art graphs illustrating the performance of the comparative examples of FIGS. 3A to 3C. In detail, FIG. 3A illustrates a comparative example in which DEM is not used, and FIGS. 3B and 3C illustrate comparative examples in which DEM is applied differently. In addition, the graph of FIG. 4A illustrates a cumulative sum of errors occurring in each of the comparative examples of FIGS. 3A to 3C in a frequency domain, and the graph of FIG. 4B illustrates power spectral density (PSD) according to each of the comparative examples of FIGS. 3A to 3C. In the comparative examples of FIGS. 3A to 3C, the signed binary data BIN may be input in the order "−1, −2, 0, 2, 1, −2, 1", and redundant descriptions of FIGS. 3A to 3C will be omitted below.

Referring to FIG. 3A, when DEM is not applied, usage frequency of some cells may be high. As illustrated in FIG. 3A, at least one cell including the fourth cell C4 may be selected according to a value of the binary data BIN other than 0. Accordingly, usage frequency of the fourth cell C4 may be high, and as errors of the fourth cell C4 are dominantly accumulated, a cumulative sum of errors may not converge.

Referring to FIG. 3B, a cell corresponding to "−1" or "+1" may be sequentially selected. As illustrated in FIG. 3B, one cell pointer (↑) may be used, and the cell pointer may be shifted unidirectionally, that is, to the right, according to an absolute value of the binary data BIN. Accordingly, cells may be evenly selected by shifting the cell pointer; however, as shifting repeats, a cumulative sum of errors may not converge to a certain value.

Referring to FIG. 3C, two cell pointers (↑, ↓) may be used according to a sign of the binary data BIN, and the two cell pointers (↑, ↓) may be mutually independently shifted. That is, as illustrated in FIG. 3C, the negative cell pointer (↑) may be shifted to the right according to negative binary data BIN, whereas the positive cell pointer (↓) may be shifted to the right according to positive binary data BIN. A DAC according to the comparative example of FIG. 3C may include overlapping circuits for storing and shifting the two cell pointers (↑, ↓).

Referring to FIG. 4A, a cumulative sum of errors according to each of the comparative examples of FIGS. 3A to 3C may have a high value at low frequency, and may have a different form from white noise having even values in the entire frequency band. In addition, referring to FIG. 4B, PSD according to each of the comparative examples of FIGS. 3A to 3C may have a different form from first noise shaping.

Figure 5:
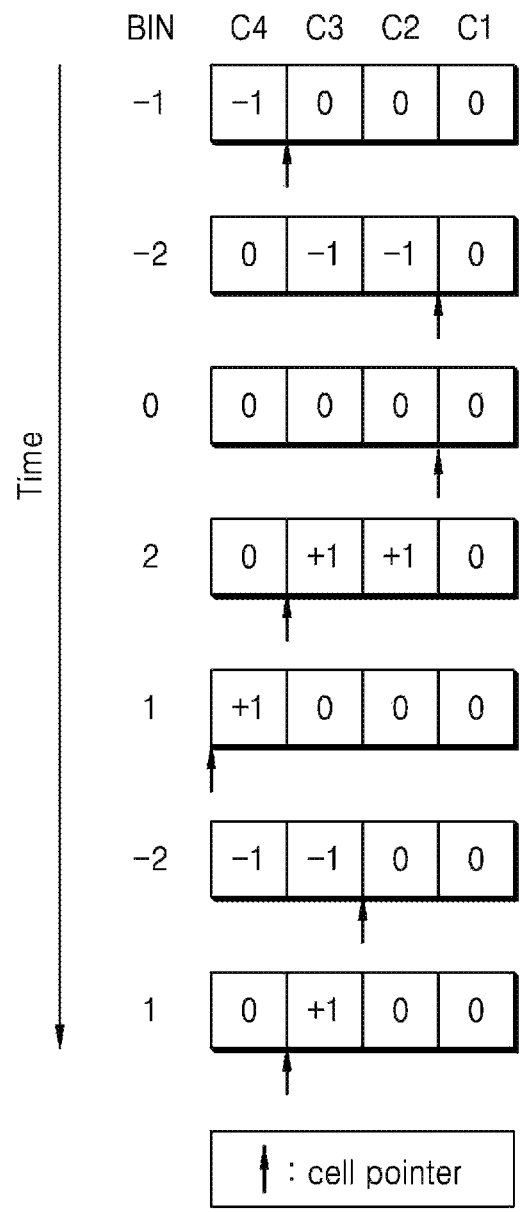
FIG. 5 is a diagram illustrating an example of controlling four cells in a given input sequence according to an example embodiment of the present disclosure.
Figure 6A:
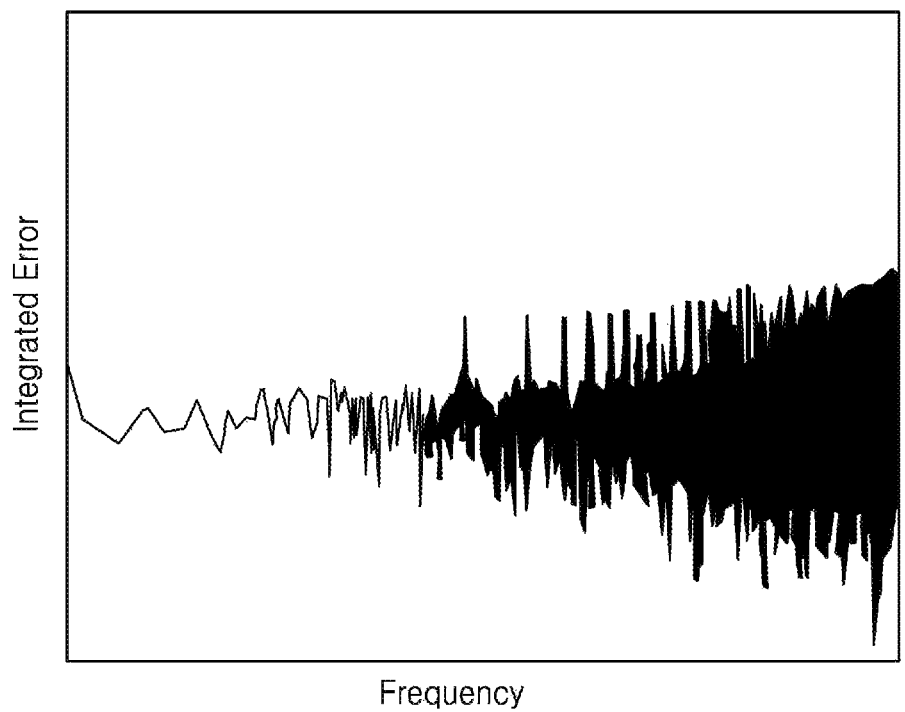
FIGS. 6A and 6B are graphs illustrating the performance of dynamic element matching (DEM) according to an example embodiment of the present disclosure.
Figure 6B:
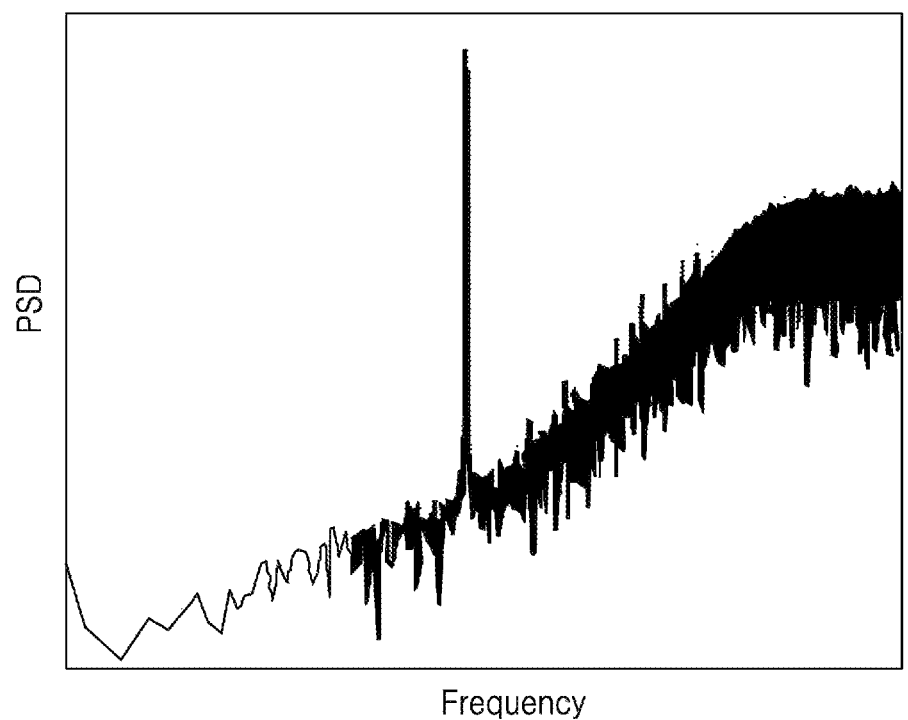

FIG. 5 is a diagram illustrating an example of controlling the four cells C1, C2, C3, and C4 in a given input sequence according to an example embodiment of the present disclosure. FIGS. 6A and 6B are graphs illustrating performance of DEM according to an example embodiment of the present disclosure. In detail, FIG. 5 illustrates an example in which the four cells C1, C2, C3, and C4 are controlled when the signed binary data BIN is input in the order of "−1, −2, 0, 2, 1, −2, 1" as in the comparative examples of FIGS. 3A to 3C, and the graphs of FIGS. 6A and 6B respectively illustrate a cumulative sum of errors and PSD of DEM according to an example embodiment of the present disclosure.

Referring to FIG. 5, according to an example embodiment of the present disclosure, one cell pointer may be used, and the cell pointer may be shifted in a direction depending on a sign of the binary data BIN. For example, as illustrated in FIG. 5, a cell pointer (↑) may be shifted to the right as much as 1 according to the binary data BIN that is "−1", and the cell pointer (↑) may be shifted to the right as much as 2 according to the binary data BIN that is "−2". In addition, the cell pointer (↑) may be maintained according to the binary data BIN that is "0". Next, the cell pointer (↑) may be shifted to the left as much as 2 according to the binary data BIN that is "2", and the cell pointer (↑) may be shifted to the left as much as 1 according to the binary data BIN that is "1". Then, the cell pointer (↑) may be shifted to the right as much as 2 according to the binary data BIN that is "−2", and the cell pointer (↑) may be shifted to the left as much as 1 according to the binary data BIN that is "1".

Referring to FIG. 6A, DEM according to an example embodiment of the present disclosure may provide a cumulative sum of errors having a similar form to white noise having even values in the entire frequency band. In addition, referring to FIG. 6B, DEM according to an example embodiment of the present disclosure may provide PSD having substantially the same form as first noise shaping. Accordingly, DEM according to one or more example embodiments of the present disclosure not only may provide better performance compared to the comparative examples of FIGS. 3A to 3C but also may employ a simpler structure compared to the comparative example of FIG. 3C in which two cell pointers are used.

FIG. 7 is a table illustrating an example of data of FIG. 1 and control signals of FIG. 2 according to an example embodiment of the present disclosure. In the example of FIG. 7, the binary data BIN may have a value of "−4" to "4".

Referring to FIG. 7, the thermometer code data T_CD may have 8 bits, and may continuously have "1" from the LSB as many as the number proportional to the binary data BIN. For example, a value "00000000" of the thermometer code data T_CD may correspond to a value "−4" of the binary data BIN, a value "00001111" of the thermometer code data T_CD may correspond to a value "0" of the binary data BIN, and a value "11111111" of the thermometer code data T_CD may correspond to a value "4" of the binary data BIN.

As illustrated in FIG. 7, the cell code data C_CD may have nine values corresponding to nine different values of the thermometer code data T_CD. In some embodiments, the preprocess circuit 620 of FIG. 1 may generate the cell code data C_CD illustrated in FIG. 7 from the thermometer code data T_CD. As described above with reference to FIG. 1, etc., the cell control data C_CT may be generated by shifting the cell code data C_CD according to a cell pointer.

In some embodiments, a selection pattern of a cell supplying positive electricity and a selection pattern of a cell supplying negative electricity may be different according to the thermometer code data T_CD (or the binary data BIN). For example, as in the cell code data C_CD of FIG. 7, a fourth value C_CD[4] of the cell code data C_CD corresponding to the fourth cell C4 according to the binary data BIN that is "4" may be "4", whereas a first value C_CD[1] of the cell code data C_CD corresponding to the first cell C1 according to the binary data BIN that is "1" may be "+1". Accordingly, a direction of cells that are selected from the cell pointer may be determined by the cell code data C_CD. That is, by the cell code data C_CD of FIG. 7, as illustrated in FIG. 5, at least one cell right to the cell pointer (↑) may be selected according to the negative binary data BIN, and at least one cell left to the cell pointer (↑) may be selected according to the positive binary data BIN.

The cell code data C_CD includes four values each having one of "−1", "0", and "+1", and therefore, may be represented by two or more pieces of 4-bit data. For example, as illustrated in FIG. 7, the cell code data C_CD may be represented by at least one of first, second, and third code signals P', N', and Z' respectively corresponding to the first, second, and third control signals P, N, and Z of FIG. 2. A shift of the cell code data C_CD due to the shift circuit 640 may refer to a shift of at least one of the three first to third code signals P', N', and Z'.

Figure 8A:
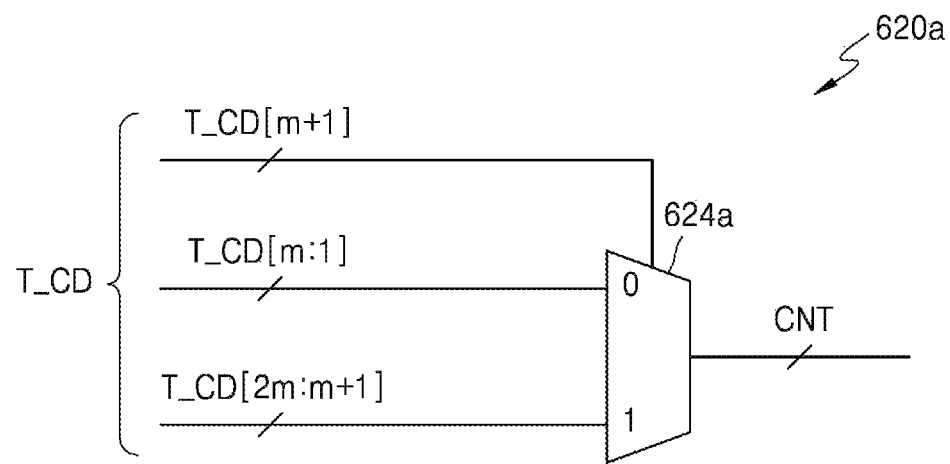
FIGS. 8A and 8B are diagrams illustrating examples of a preprocess circuit of FIG. 1 according to example embodiments of the present disclosure.
Figure 8B:
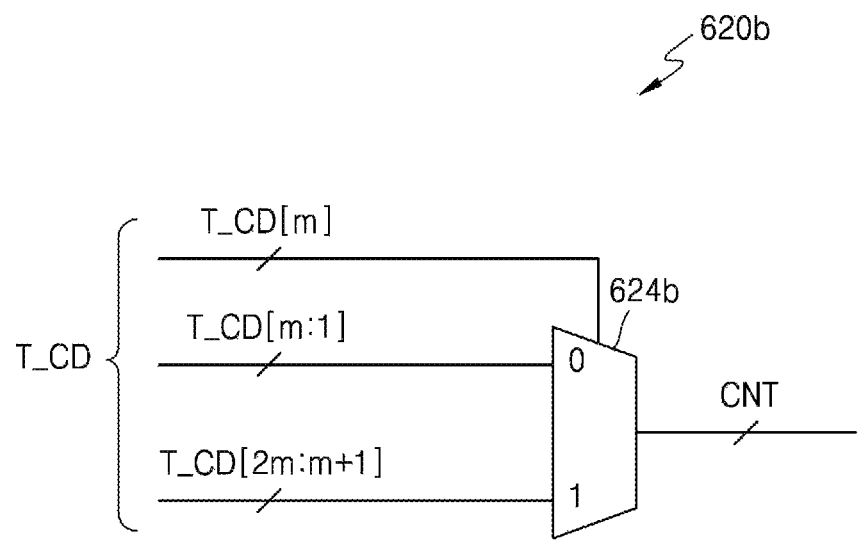

FIGS. 8A and 8B are diagrams illustrating examples of the preprocess circuit 620 of FIG. 1 according to example embodiments of the present disclosure. In addition, tables of the shift count CNT output by preprocess circuits 620a and 620b in FIGS. 8A and 8B are illustrated. As described above with reference to FIG. 1, the preprocess circuits 620a and 620b of FIGS. 8A and 8B may receive the 2m-bit thermometer code data T_CD (that is, k=2m), and may generate the shift count CNT from the thermometer code data T_CD. Hereinafter, FIGS. 8A and 8B will be described with reference to FIG. 7, and redundant descriptions of FIGS. 8A and 8B will be omitted.

Referring to FIG. 7, the 4-bit first code signal P' may match upper 4 bits of the thermometer code data T_CD. In addition, the second code signal N' may match bits obtained by inverting lower 4 bits of the thermometer code data T_CD. The third code signal Z' may match bits obtained by inverting the first code signal P' when the binary data BIN is positive, and may match the lower 4 bits of the thermometer code data T_CD when the binary data BIN is negative. Using this, although not illustrated in FIGS. 8A and 8B, the preprocess circuits 620a and 620b may generate the first code signal P' and the third code signal Z' from the thermometer code data T_CD.

Referring to FIG. 8A, the preprocess circuit 620a may include a multiplexer 624a. The multiplexer 624a, which is an m-bit 2:1 multiplexer, may output one of lower m bits T_CD[m:1] of the thermometer code data T_CD and upper m bits T_CD[2m:m+1] of the thermometer code data T_CD as the shift count CNT according to a $(m+1)^{th}$ bit T_CD[m+1] of the thermometer code data T_CD. When m is 4, the $(m+1)^{th}$ bit T_CD[m+1] of the thermometer code data T_CD may correspond to "T_CD[5]" of FIG. 7, and when the $(m+1)^{th}$ bit T_CD[m+1] of the thermometer code data T_CD is "1", the binary data BIN may be positive, whereas, when the $(m+1)^{th}$ bit T_CD[m+1] of the thermometer code data T_CD is "0", the binary data BIN may be zero or negative.

As illustrated in the table of FIG. 8A, the number of "1's" included in the shift count CNT may denote a shift amount of the cell pointer. Accordingly, the cell pointer may be shifted in proportion to an absolute value of the binary data BIN in a direction determined according to a sign of the binary data BIN. For example, while the shift count CNT of "0001" may be generated according to the binary data BIN that is "1", the shift count CNT of "0111" may be generated according to the binary data BIN that is "−1". Since the cell pointer is 4-bit cyclic or circular shifted, the shift count CNT of "0001" and the shift count CNT of "0111" may denote shifts as much as 1 in mutually opposite directions. In addition, the shift count CNT of "1111" may be generated according to the binary data BIN that is "0", and the shift count CNT of "1111" may have the same effect as not shifting the cell pointer by cyclic or circular shifting the cell pointer as much as 4, that is, the shift count CNT of "0000".

Referring to FIG. 8B, the preprocess circuit 620b may include a multiplexer 624b. Compared to the preprocess circuit 620a of FIG. 8A, the multiplexer 624b of FIG. 8B may output one of lower m bits T_CD[m:1] of the thermometer code data T_CD and upper m bits T_CD[2m:m+1] of the thermometer code data T_CD as the shift count CNT according to a $m^{th}$ bit T_CD[m] of the thermometer code data T_CD. Accordingly, as illustrated in the table of FIG. 8B, the shift count CNT of "0000" may be generated according to the binary data BIN that is "0".

Figure 9:
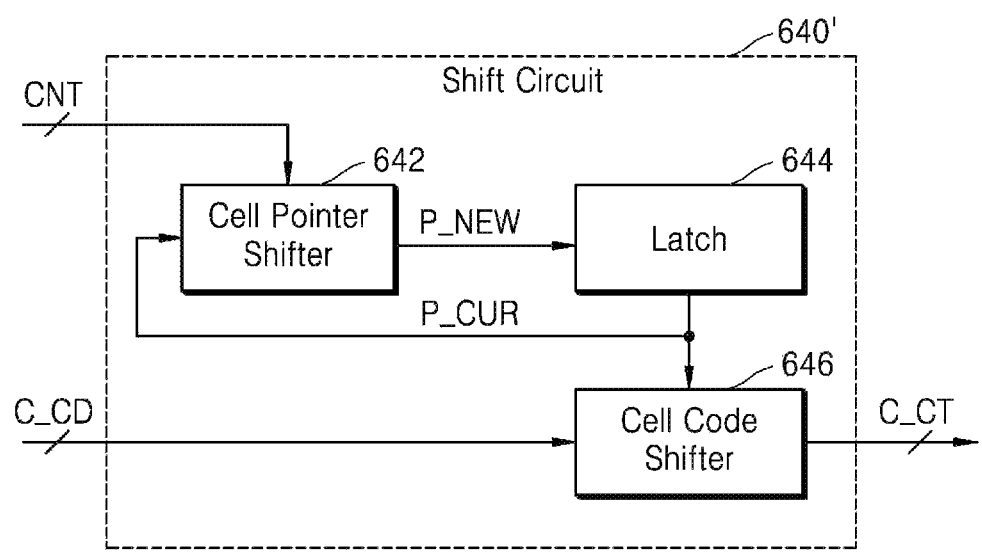
FIG. 9 is a block diagram illustrating an example of a shift circuit of FIG. 1 according to an example embodiment of the present disclosure.

FIG. 9 is a block diagram illustrating an example of the shift circuit 640 of FIG. 1 according to an example embodiment of the present disclosure. As described above with reference to FIG. 1, a shift circuit 640' of FIG. 9 may receive the shift count CNT and the cell code data C_CD from the preprocess circuit 620, and may generate the cell control data C_CT. As illustrated in FIG. 9, the shift circuit 640' may include a cell pointer shifter 642, a latch 644, and a cell code shifter 646.

The latch 644 may store a current cell pointer P_CUR which is used to shift the cell code data C_CD, and may output the stored current cell pointer P_CUR. The cell pointer shifter 642 may generate a new cell pointer P_NEW which will be used to shift the following cell code data C_CD by shifting the current cell pointer P_CUR according to the shift count CNT, and may provide the new cell pointer P_NEW to the latch 644. In addition, the cell code shifter 646 may generate the cell control data C_CT by shifting the cell code data C_CD according to the current cell pointer P_CUR. The cell pointer shifter 642 and the cell code shifter 646 may have an arbitrary shifter structure. For example, as non-limiting examples, the cell pointer shifter 642 and the cell code shifter 646 may have a structure of a barrel shifter, a logarithm shifter, etc.

Figure 10:
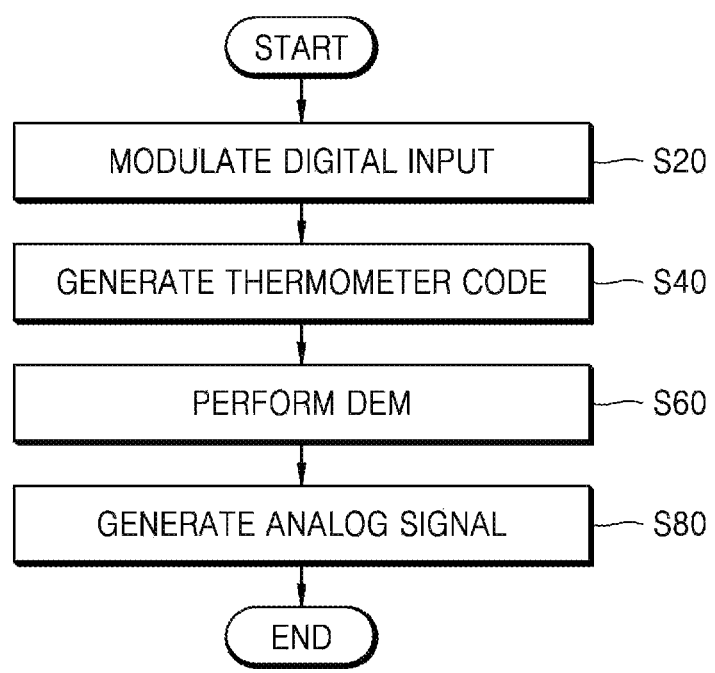
FIG. 10 is a flowchart illustrating a method for digital-to-analog conversion using 3-level cells, according to an example embodiment of the present disclosure.

FIG. 10 is a flowchart illustrating a method for digital-to-analog conversion using 3-level cells, according to an example embodiment of the present disclosure. As illustrated in FIG. 10, the method for digital-to-analog conversion may include a plurality of operations S20, S40, S60, and S80. In some embodiments, the method of FIG. 10 may be performed by the DAC 10 of FIG. 1, and FIG. 10 will be hereinafter described with reference to FIG. 1.

In operation S20, an operation of modulating a digital input may be performed. For example, the delta-sigma modulator 200 may generate the binary data (or binary code) BIN by oversampling the input signal IN, which is a digital signal.

In operation S40, an operation of generating thermometer code may be performed. For example, the thermometer encoder 400 may convert the binary data BIN into the thermometer code data T_CD. In some embodiments, as described above with reference to FIG. 1, the thermometer code data T_CD may include "1's" as many as the number proportional to the binary data BIN.

In operation S60, DEM may be performed. For example, the DEM block 600 may use one cell pointer pointing to one of a plurality of 3-level cells, and may determine a shift direction of the cell pointer according to a sign of the binary data BIN. An example of operation S60 will be described below with reference to FIG. 11.

In operation S80, an operation of generating an analog signal may be performed. For example, the analog generator 800 may include the m cells C1, C2, . . . , and Cm, and each of the plurality of 3-level cells may provide one of positive electricity, negative electricity, and floating according to the cell control data C_CT received from the DEM block 600 (or control signals generated from the cell control data C_CT). The summer 820 of the analog generator 800 may generate the output signal OUT, which is an analog signal, by summing positive electricity and negative electricity provided from the m cells C1, C2, . . . , and Cm.

Figure 11:
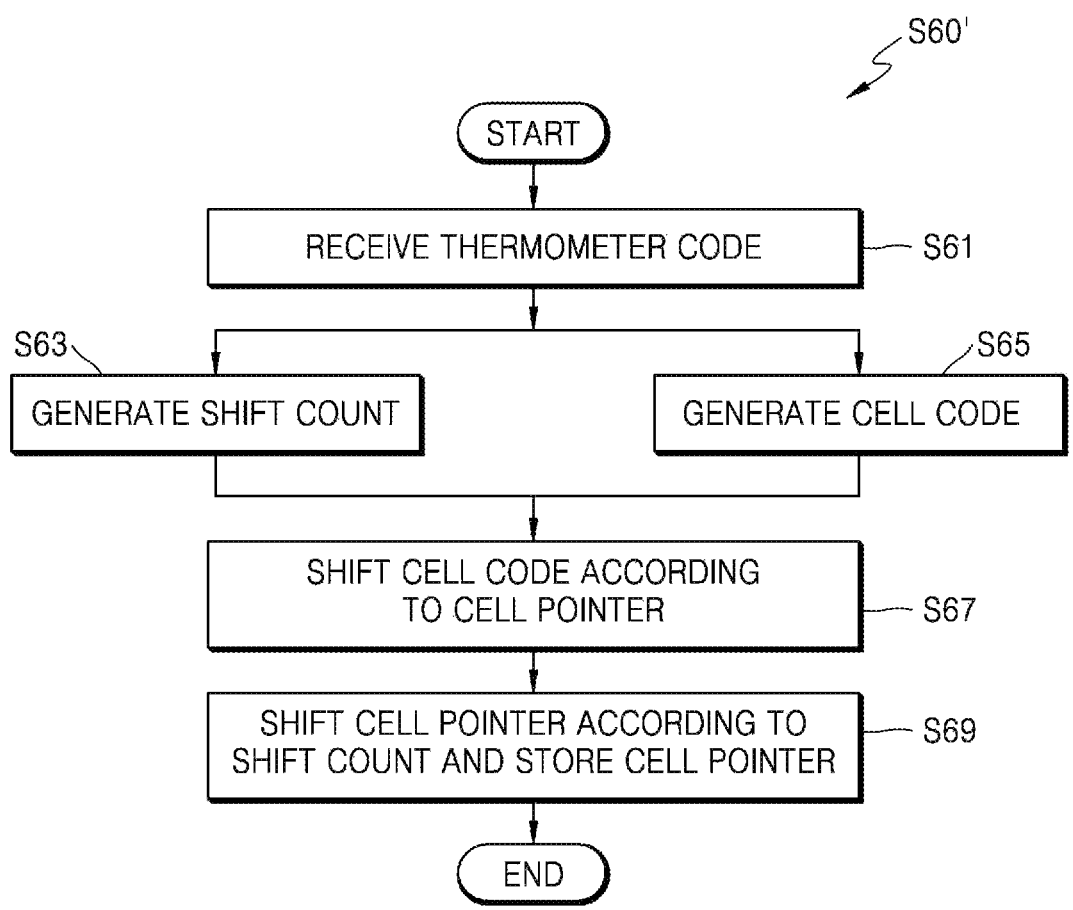
FIG. 11 is a flowchart illustrating an example of operation S60 of FIG. 10 according to an example embodiment of the present disclosure.

FIG. 11 is a flowchart illustrating an example of operation S60 of FIG. 10 according to an example embodiment of the present disclosure. As described above with reference to FIG. 10, in operation S60' of FIG. 11, DEM may be performed. As illustrated in FIG. 11, operation S60' of FIG. 11 may include a plurality of operations S61, S63, S65, S67, and S69, and FIG. 11 will be hereinafter described with reference to FIG. 1.

In operation S61, an operation of receiving thermometer code may be performed. For example, the preprocess circuit 620 of the DEM block 600 may receive the thermometer code data T_CD from the thermometer encoder 400.

In operation S63, an operation of generating a shift count may be performed. The shift count is for shifting a cell pointer, and for example, the preprocess circuit 620 may generate the shift count CNT from the thermometer code data T_CD.

In operation S65, an operation of generating cell code may be performed. The cell code, which is data for controlling m cells included in the analog generator 800, may include information regarding outputs of the m cells. For example, the preprocess circuit 620 may generate the cell code data C_CD from the thermometer code data T_CD, and the preprocess circuit 620 may generate the cell code data C_CD such that a pattern of selecting cells varies according to a sign of the binary data BIN.

In operation S67, an operation of shifting the cell code according to a cell pointer may be performed. For example, the shift circuit 640 may store a cell pointer, and may generate the cell control data C_CT by shifting the cell code data C_CD according to the stored cell pointer.

In operation S69, an operation of shifting the cell pointer according to the shift count and storing the cell pointer may be performed. For example, the shift circuit 640 may shift the cell pointer used to shift the cell code data C_CD according to the shift count CNT, and may store the shifted cell pointer.

Figure 12:
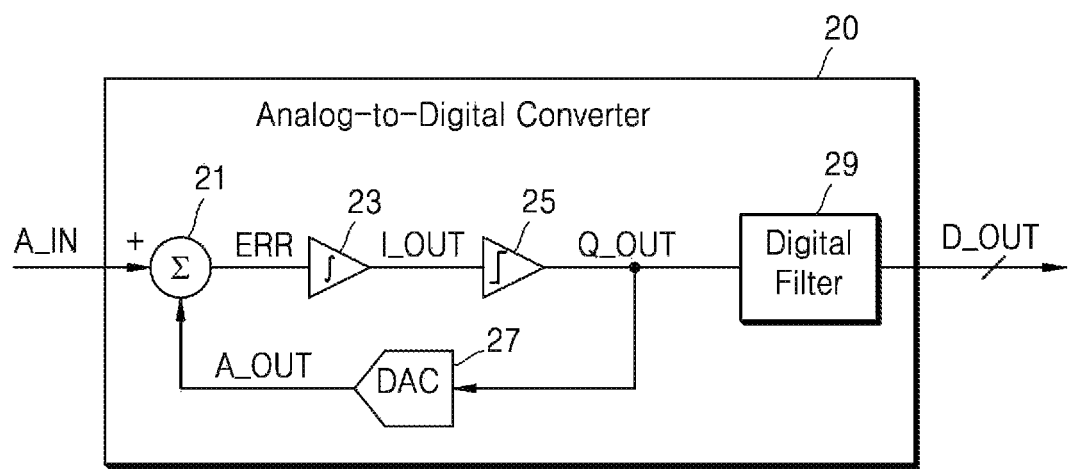
FIG. 12 is a block diagram illustrating an analog-to-digital converter including a DAC according to an example embodiment of the present disclosure.

FIG. 12 is a block diagram illustrating an analog-to-digital converter 20 including a DAC according to an example embodiment of the present disclosure. The DAC according to example embodiments of the present disclosure may be independently used to convert a digital signal into an analog signal, or as illustrated in FIG. 12, may be used to convert an analog signal into a digital signal.

Referring to FIG. 12, the analog-to-digital converter 20 may have a delta-sigma structure, and may generate a digital output signal D_OUT by converting an analog input signal A_IN. The analog-to-digital converter 20 may include a summing circuit 21, an integration circuit 23, a quantization circuit 25, a DAC 27, and a digital filter 29.

The summing circuit 21 may generate an error signal ERR corresponding to a difference between the analog input signal A_IN and a DAC output signal A_OUT. The integration circuit 23 may generate an integration output signal LOUT by accumulating the error signal ERR, and the quantization circuit 25 may generate a quantized signal Q_OUT by quantizing the integration output signal LOUT. The digital filter 29 may generate the digital output signal D_OUT by filtering, for example, low pass filtering, the quantized signal Q_OUT.

The DAC 27 may generate the DAC output signal A_OUT, which is an analog signal, by converting the quantized signal Q_OUT, which is a digital signal. As described above, according to example embodiments of the present disclosure, the DAC 27 may provide improved linearity with a simple structure, and thus, the analog-to-digital converter 20 may have reduced cost and improved performance.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. A circuit for digital-to-analog conversion using a plurality of 3-level cells mutually independently providing positive electricity, negative electricity or floating, the circuit comprising:
a preprocess circuit configured to receive thermometer code data generated from signed binary data and generate, from the thermometer code data, a shift count for shifting a cell pointer pointing to one of the plurality of 3-level cells for dynamic element matching (DEM); and
a shift circuit configured to store the cell pointer and shift the cell pointer according to the shift count, wherein
the cell pointer is shifted in proportion to an absolute value of the signed binary data in a direction depending on a sign of the signed binary data.

2. The circuit of claim 1, wherein:
a value represented by the signed binary data identifies a number of "1's" within the thermometer code data,
the shift circuit is configured to shift the cell pointer according to the number of "1's" within in the shift count, and
the preprocess circuit is configured to generate the shift count from upper half bits of the thermometer code data when the signed binary data is positive and from lower half bits of the thermometer code data when the signed binary data is negative.

3. The circuit of claim 1, wherein:
the preprocess circuit is configured to generate cell code data from the thermometer code data, and
the shift circuit is configured to generate cell control data, which is provided to the plurality of 3-level cells, by shifting the cell code data according to the cell pointer.

4. The circuit of claim 3, wherein:
the preprocess circuit is configured to generate the cell code data comprising first code data, second code data, or third code data, and
each of the plurality of 3-level cells provides the positive electricity according to the first code data, provides the negative electricity according to the second code data, and provides the floating according to the third code data.

5. The circuit of claim 4, wherein the preprocess circuit is configured to generate the first code data using upper half bits of the thermometer code data.

6. The circuit of claim 4, wherein the preprocess circuit is configured to generate the second code data by inverting lower half bits of the thermometer code data.

7. The circuit of claim 4, wherein the preprocess circuit is configured to generate the third code data by inverting upper half bits of the thermometer code data when the signed binary data is positive and generate the third code data using lower half bits of the thermometer code data when the signed binary data is zero or negative.

8. The circuit of claim 3, further comprising:
an analog generator comprising the plurality of 3-level cells and a summing circuit that sums electricity provided by the plurality of 3-level cells, wherein
the plurality of 3-level cells are configured to supply current to the summing circuit using the positive electricity, withdraw current from the summing circuit using the negative electricity, or float a terminal connected to the summing circuit according to the cell control data.

9. A circuit for digital-to-analog conversion using m 3-level cells mutually independently providing positive electricity, negative electricity or floating, where the m is an integer greater than 1, the circuit comprising:
a preprocess circuit comprising a first logic circuit configured to output a shift count for shifting a cell pointer pointing to one of the m 3-level cells for dynamic element matching (DEM) by performing a bitwise operation on thermometer code data, which is 2m bits, generated from signed binary data; and
a shift circuit comprising a latch that stores the cell pointer and a first shifter configured to shift the cell pointer stored in the latch according to the shift count, wherein
an output of the first shifter coincides with the cell pointer stored in the latch being shifted in proportion to an absolute value of the signed binary data in a direction depending on a sign of the signed binary data.

10. The circuit of claim 9, wherein:
a value represented by the signed binary data identifies a number of "1's" within the thermometer code data,
the first shifter is configured to shift the cell pointer according to the number of "1's" within the shift count, and
the first logic circuit is configured to output upper m-bits of the thermometer code data when a least significant bit of the upper m-bits of the thermometer code data is "1" and outputs lower m-bits of the thermometer code data when the least significant bit is "0".

11. The circuit of claim 9, wherein:
the preprocess circuit further comprises a second logic circuit configured to generate cell code data by performing a bitwise operation on the thermometer code data, and
the shift circuit further comprises a second shifter configured to output cell control data, which is provided to the m 3-level cells, by shifting the cell code data according to the cell pointer stored in the latch.

12. The circuit of claim 11, wherein:
the second logic circuit is configured to generate the cell code data comprising at least one of m-bit first code data, m-bit second code data, and m-bit third code data, and
each of the m 3-level cells provides the positive electricity according to the first code data, provides the negative electricity according to the second code data, and provides the floating according to the third code data.

13. The circuit of claim 12, wherein the second logic circuit is configured to output upper m-bits of the thermometer code data as the first code data.

14. The circuit of claim 12, wherein the second logic circuit is configured to output the second code data by inverting lower m-bits of the thermometer code data.

15. The circuit of claim 12, wherein the second logic circuit is configured to output the third code data by inverting upper m-bits of the thermometer code data when a least significant bit of the upper m-bits of the thermometer code data is "1" and output lower m-bits of the thermometer code data as the third code data when the least significant bit is "0".

16. The circuit of claim 12, further comprising:
an analog generator comprising the m 3-level cells and a summing circuit that sums electricity provided by the m 3-level cells, wherein
the m 3-level cells are configured to supply current to the summing circuit using the positive electricity, withdraw current from the summing circuit using the negative electricity, or float a terminal connected to the summing circuit according to the cell control data.

17. A method for digital-to-analog conversion using a plurality of 3-level cells mutually independently providing positive electricity, negative electricity or floating, the method comprising:
- receiving thermometer code data generated from signed binary data;
- generating, from the thermometer code data, a shift count for shifting a cell pointer pointing to one of the plurality of 3-level cells for dynamic element matching (DEM); and
- shifting the cell pointer according to the shift count and storing the cell pointer, wherein
- the cell pointer is shifted in proportion to an absolute value of the signed binary data in a direction depending on a sign of the signed binary data.

18. The method of claim 17, wherein:
- a value represented by the signed binary data identifies a number of "1's" within the thermometer code data,
- the shifting comprises shifting the cell pointer according to the number of "1's" within the shift count, and
- the generating of the shift count comprises generating the shift count from upper half bits of the thermometer code data when the signed binary data is positive and from lower half bits of the thermometer code data when the signed binary data is negative.

19. The method of claim 17, further comprising:
- generating cell code data from the thermometer code data; and
- before the shifting of the cell pointer, generating cell control data, which is provided to the plurality of 3-level cells, by shifting the cell code data according to the cell pointer.

20. The method of claim 19, further comprising generating an analog signal by summing the positive electricity, the negative electricity, and the floating provided by the plurality of 3-level cells according to the cell control data.

* * * * *